United States Patent [19]

Schultz et al.

[11] Patent Number: 5,107,190
[45] Date of Patent: Apr. 21, 1992

[54] MEANS AND METHOD FOR OPTIMIZING THE SWITCHING PERFORMANCE OF POWER AMPLIFIERS

[75] Inventors: Warren I. Schultz; Denise M. Williams, both of Tempe, Ariz.

[73] Assignee: Motorola, Inc., Schaumburg, Ill.

[21] Appl. No.: 542,456

[22] Filed: Jun. 22, 1990

[51] Int. Cl.$^5$ .................... H01J 29/70; H01J 29/72
[52] U.S. Cl. ..................... 315/387; 315/408
[58] Field of Search ................ 315/408, 387, 389

[56] References Cited

U.S. PATENT DOCUMENTS

| | | | |
|---|---|---|---|
| 4,177,414 | 12/1979 | Roesel, Jr. et al. | 322/28 |
| 4,581,563 | 4/1986 | Rockrohr | 315/388 |
| 4,990,834 | 2/1991 | Van Dalfsen | 315/408 |

Primary Examiner—Theodore M. Blum
Attorney, Agent, or Firm—Robert M. Handy; Eugene A. Parsons

[57] ABSTRACT

Reduced transient power dissipation and reduced variation of the transient power dissipation are obtained in high frequency power amplifiers, e.g., CRT horizontal deflection amplifiers, by sampling the amplifier output at and/or during the turning-off interval (e.g., during the storage time when transient power dissipation is still low and optionally also during turn-off when transient dissipation is large) and then, after a suitable delay, feeding back a signal proportional to the sampled output to the amplifier input driver to control the magnitude of the input drive during a subsequent amplifier-on interval. The desired delay corresponds approximately to the intervening amplifier-off interval.

7 Claims, 5 Drawing Sheets

FIG. 1
PRIOR ART

FIG. 2
TIME →

MEANS AND METHOD FOR OPTIMIZING THE SWITCHING PERFORMANCE OF POWER AMPLIFIERS

FIELD OF THE INVENTION

The present invention relates to power amplifiers and, more particularly, means and methods for optimizing the switching performance of power amplifiers to minimize the transient energy dissipated therein.

BACKGROUND OF THE INVENTION

Power amplifiers are frequently used as switches to drive various kinds of electrical loads, such as for example, motors, power supplies, CRT deflection yokes, transformers, inductors, capacitors, resistors and combinations thereof. It is commonplace for such power amplifiers to switch currents of from one to hundreds of amperes or more and to stand off voltages of from a hundred to several thousand volts or more. The exact combination of forward conduction current and blocking voltage that must be handled by the power amplifier will depend upon the energy source, the load and the desired waveform. As is well known in the art, a variety of other operating parameters of the energy source, the load and the switch are important for design of a reliable and economical system.

All amplifiers dissipate energy internally while operating. At DC or low frequencies, the transient (i.e., switching) energy loss is negligible and the principal energy loss is determined by the product of the forward current times the forward voltage drop when the switch is on. The loss due to leakage current flowing when the amplifier or switch is off is usually negligible.

As the operating frequency of the amplifier increases the transient or switching energy loss increases. The transient or switching energy loss is that energy loss which occurs when the amplifier or switch is changing from the conductive to the non-conductive state and/or vice-versa. Other things being equal, the transient energy loss increases in direct proportion to the operating frequency. For many power amplifiers the transient energy loss can become very significant at frequencies of a few kilohertz or more. This is especially true in transistor amplifiers which have been designed to have low forward voltage drop.

One application where the transient energy loss is of significant concern is in power amplifiers driving inductive or resonant loads, as for example, the yoke of a cathode ray tube (CRT) deflection system. The horizontal deflection amplifier is usually the more difficult to accomplish since it typically operates at a higher frequency than the vertical deflection amplifier. Prior art horizontal deflection amplifiers or systems are described, for example, in U.S. Pat. No. 4,670,692, 4,642,533, 4,205,259, 3,501,672 and 3,480,826, which are incorporated herein by reference.

The switching rate or operating frequency of the deflection amplifier is one factor that determines the degree of resolution of an image formed on the CRT. As the need has increased for progressively higher resolution, so has deflection amplifier operating frequency. Deflection amplifiers operating at 64–270 kHz or higher are now much desired. An improved horizontal deflection amplifier is described in U.S. Pat. No. 4,897,580 to Schultz which is also incorporated herein by reference.

Despite various attempts to reduce the internal energy dissipation in power amplifiers, significant problems well known in the art remain. This is especially true for power amplifiers operating at higher frequencies where transient (i.e., switching) energy losses predominate.

A further problem well known in the art is that active devices used in power amplifiers are subject to considerable variations in parameters from device to device. Thus, while a particular amplifier circuit may be adjusted to provide minimum dissipation with a particular amplifier device or combination of devices, if another nominally identical amplifier device is substituted, the circuit must be readjusted in order to still provide minimum dissipation. Such tuning or tweaking of the circuit to match the properties of individual devices is impractical in systems which must be manufactured in large volume and at low cost. The problem is further complicated by the fact that the various properties of active devices typically used in such power amplifiers are interrelated and optimization of one parameter, e.g., forward voltage drop may adversely affect other parameters, e.g., turn-off time, or vice versa.

BRIEF DESCRIPTION OF THE INVENTION

Accordingly, it is an object of the present invention to provide an improved means and method for power amplifiers to reduce the transient energy dissipated therein. It is a further object to provide an improved means and method for driving inductive and/or resonant loads, particularly loads found in CRT deflection circuits or motor drive circuits or the like, and especially those operating at comparatively high repetition rates. It is a still further object of the present invention to provide a power amplifier whose transient energy dissipation is less sensitive to variations in individual amplifier device or component characteristics.

These and other objects and advantages are provided, in a first embodiment, by an electronic apparatus for driving a load, comprising, a power amplifier having an output for coupling to the load, driver means coupled to the input of the amplifier for providing current thereto during a first portion of a repetitive signal (e.g., when the amplifier is on), sampling means coupled to the output of the amplifier for measuring the amplifier output during a second portion of the repetitive signal following the first portion thereof (e.g., when the amplifier is being turned off), and feedback means coupled to the sampling means for regulating the current provided to the amplifier during the first portion of a subsequent occurrence of the repetitive signal in response to the sampled output.

In a preferred embodiment, the sampled output is stored temporarily, for example until the beginning of the next cycle of the repetitive signal so that it may be used via the feedback means to vary the current being supplied to the amplifier during the first portion of the following repetitive signal (e.g., when the amplifier is turned on again). A regulator responsive to the time-delayed feedback signal from the sampling means is conveniently used to vary the current being supplied to the amplifier.

In a typical arrangement, the driver means provides an amplifier input current having a first direction during the first portion of the repetitive signal (e.g., amplifier turned on) and having a second, opposite direction during a first part of the second portion of the repetitive signal (e.g., amplifier being turned off). The sampling means desirably measures the amplifier output during this first part of the second portion of the repetitive signal and then, via the time-delay in the feedback means, adjusts a regulator controlling the current supplied to the amplifier input by the driver means during the following first portion of the repetitive signal.

In the case of a CRT driver, the amplifier typically comprises a bipolar transistor and the amplifier output voltage measured by the sampling means is proportional to the emitter-collector voltage. A storage capacitor and a diode are typically coupled across the output of the bipolar transistor and, in cooperation with the deflection coil, provide a resonant load.

The amplifying transistor or transistor combination typically receives current from the driver during the first portion of the cycle (e.g., amplifier on) and returns current during the first part of the second portion of the repetitive signal (e.g., amplifier being driven off). The output of the transistor or transistor combination exhibits a low first voltage during a first portion of the repetitive signal or cycle (amplifier on), a second somewhat higher but still comparatively small voltage of the same polarity during the first part of the second portion of the cycle (amplifier being driven off), a third, very much larger substantially half-sine-wave output voltage of the same polarity during a second part of the second portion of the cycle (amplifier resonantly turning off), and a polarity reversal during a further portion of the cycle (shunting diode turning on). The sampling means desirably measures the amplifier output during the first part of the second portion of the repetitive signal.

The improved performance is accomplished in a preferred embodiment by an improved method for driving an amplifier having a load, comprising, (i) providing to an input of the amplifier and for a first time period, a current of a polarity to turn the amplifier on, then providing to the input of the amplifier and for a second time period, a current of a polarity to turn the amplifier off, (ii) during the second time period, and desirably when the amplifier operation is still controlled by charge stored within the amplifier from the previous "on" state, sampling an output of the amplifier to determine a value proportional to the output, and (iii) once again providing to an input of the amplifier and for a following time period, a current of a polarity to turn the amplifier on, wherein the current supplied during the following time period is adjusted depending upon the value determined during the second time period. Where the first and second time periods are first and second parts of a repetitive cycle, the following time period corresponds to the first part of a subsequent repetitive cycle. In a preferred embodiment, the sampling step comprises temporarily storing the value or another value related thereto, for example, until the first part of the next repetitive cycle.

The above-described invention will be more fully understood by reference to the accompanying figures and description thereof that follows.

DETAILED DESCRIPTION OF THE DRAWINGS

Figure 1:
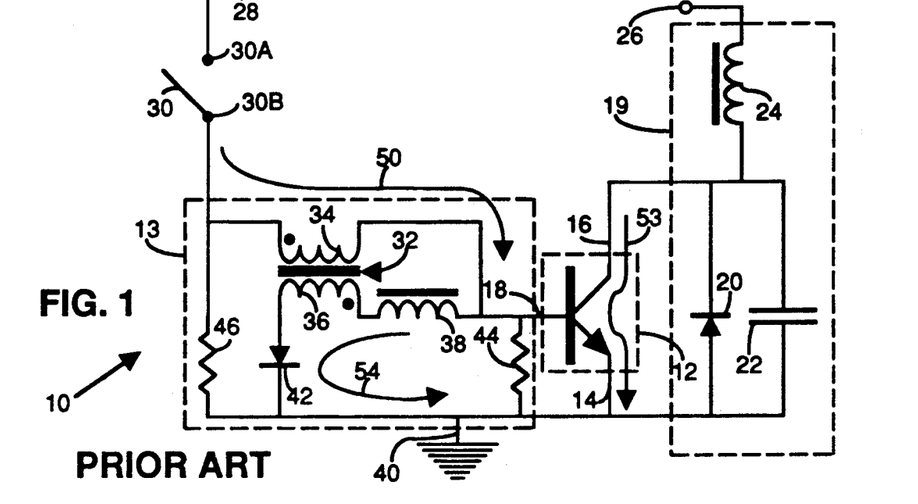
FIG. 1 is a circuit for driving a load such as for example a CRT deflection coil, similar to that described in U.S. Pat. No. 4,897,580.

FIG. 1 shows circuit 10 for driving a load such as for example a CRT horizontal deflection coil, similar to that described in U.S. Pat. No. 4,897,580. Circuit 10 comprises power amplifier 12 having common or reference connection 14, output connection 16 and input connection 18. For convenience of explanation and not intended to be limiting, amplifier 12 is shown as a bipolar transistor where common connection 14 is the emitter connection, output connection 16 is the collector connection and input connection 18 is the base connection. Those of skill in the art will understand based on the description herein that other amplifying devices or combinations of devices could also be used. Non-limiting examples of other devices are MOSFET's, JEFET's, IGBT's, GTO's and SCR's in single or multiple connections, for examples as Darlingtons, multistage amplifiers, cascode amplifiers or other arrangements.

Coupled to the output of amplifier 12 is load 19, comprising in this example, diode 20, storage capacitor 22 and horizontal deflection yoke coil 24, and DC power supply connection 26. Coil 24, diode 20 and capacitor 22 form a resonant load. While the connection of transistor 12, diode 20, capacitor 22 and coil 24 shown in FIG. 1 is convenient, many other arrangements may also be used. Other means for coupling amplifier 12, yoke coil 24, capacitor 22 and diode 20 are well known in the art and various alternatives are illustrated, for example, in U.S. Pat. Nos. 4,670,692, 4,642,533, 4,205,259, 3,501,672, 3,480,826 and 4,897,580. Other types of resonant or non-resonant loads may also be provided.

Input 18 of amplifier 12 is driven from DC power supply terminal 28 through rapidly acting switch 30 and driver circuit 13. Driver circuit 13 conveniently comprises transformer 32 having primary winding 34 and secondary winding 36. Coil 38 is connected between one end of transformer secondary 36 and amplifier input 18. The other end of transformer secondary 36 is coupled to reference or common terminal 40 through diode 42. Resistor 44 is conveniently but not essentially provided between amplifier input 18 and common terminal 40 which is also tied to amplifier reference or common terminal 14. Resistor 46 is conveniently but not essentially provided between switch 30 and reference terminal 40.

The operation of circuit 10 will now be briefly described for the situation where coil 24 is intended to function as a horizontal deflection coil of a cathode ray tube (CRT). The CRT deflection application described herein is intended merely for convenience of understanding and not intended to be limiting. Further details of the operation of circuit 10 are provided in U.S. Pat. No. 4,897,580. Reference should also be had to the waveform traces of the amplifier input current ($I_b$), amplifier output current ($I_c$) and amplifier output voltage ($V_{ce}$) illustrated in FIG. 2. Switch 30 is any form of rapid acting switch, and when circuit 10 is used for horizontal CRT deflection, opens and closes typically at the desired horizontal scan frequency whose period 48 is noted in FIG. 2.

Figure 3:
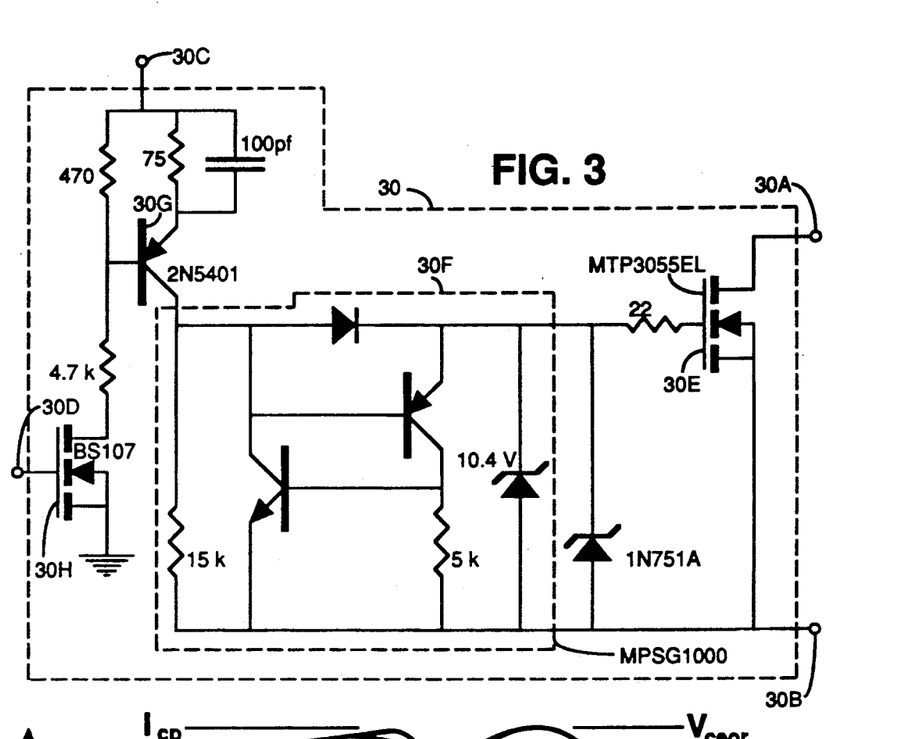
FIG. 3 is a simplified schematic diagram of a circuit of a rapid acting switch suitable for use in connection with the circuit of FIG. 1.

FIG. 3 shows a suitable circuit arrangement for providing fast acting switch 30. Typical components or component values are identified thereon. Terminals 30A-B of switch 30 connect to circuit 10 as shown in FIG. 1, terminal 30C connects to a DC supply and terminal 30D connects to the input clock source for the repetitive signal, as for example, the horizontal oscillator output for the CRT display. Switching transistor 30E (e.g., Motorola type MTP3055EL) and the components within the dashed line 30F (e.g., Motorola type MPSG1000) are available from Motorola, Inc., Phoenix, Ariz., and transistors 30G, 30H and other components are available from sources well known in the art.

The function of the circuit shown in FIG. 3 is to turn transistor 30E on and off in synchronism with a clock signal (e.g., the horizontal oscillator) presented at terminal 30D. The operation of the circuit of FIG. 3 will be understood by those of skill in the art and is described in Motorola Semiconductor Application Note AN1076 entitled "Speeding up Horizontal Outputs", available from Motorola, Inc., Literature Distribution, P.O. Box 20912, Phoenix, Ariz. 85036. While the circuit of FIG. 3 is preferred for switch 30, other fast acting switch circuits may also be used.

Referring once again to FIGS. 1-2, when switch 30 closes, current 50 (see FIG. 1) flows through transformer primary 34 to amplifier input 18. Switch 30 remains closed for interval 52 in FIG. 2 during which input current $I_b$ increases approximately linearly as shown in the upper trace of FIG. 2 (left side). There is a corresponding increase in output current 53 (see FIGS. 1-2), which for convenience is designated as $I_c$ and shown in the middle trace of FIG. 2. The input current $I_b$ and the output current $I_c$ are related. For convenience of future reference, the input current $I_b$ flowing during interval 52 is referred to as the forward input current $I_{bf}$ and identified as current 50 in FIG. 1 and $I_{bf}$ in FIG. 2. The portion of the output current $I_c$ (current 53 in FIG. 1) which corresponds to $I_{bf}$ is identified in FIG. 2 as $I_{cf}$.

Figure 2:
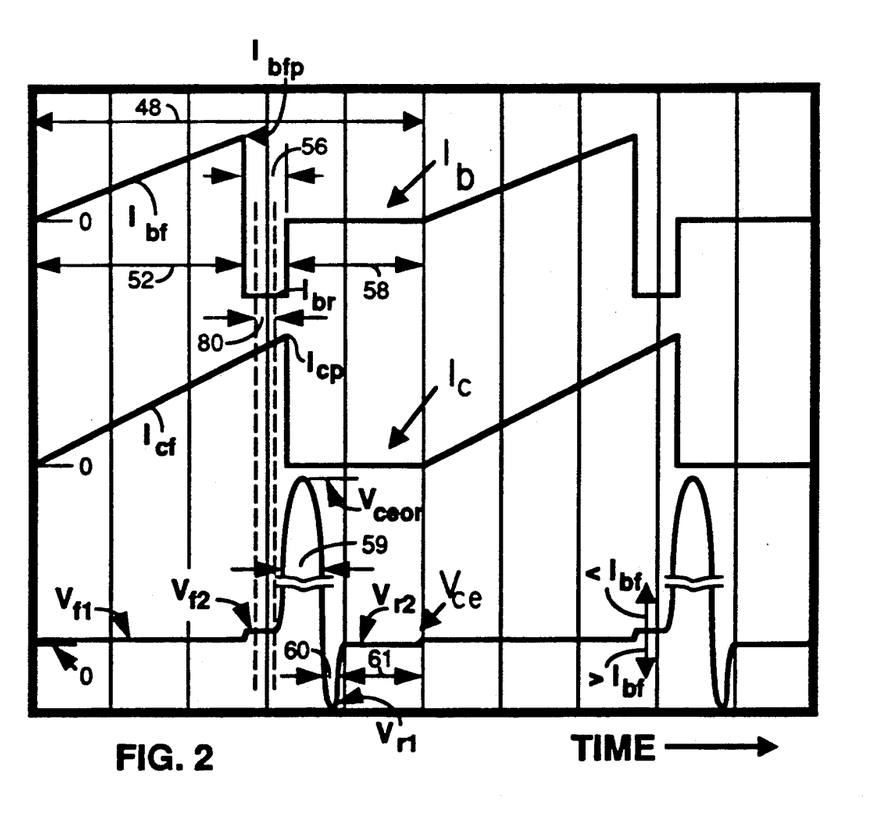
FIG. 2 is a simplified waveform diagram of the input current, output current and output voltage associated with the power amplifier transistor of the circuit of FIG. 1.

At the end of interval 52, switch 30 opens and the collapsing magnetization in the windings of transformer 32 cause an immediate reversal of the input current $I_b$ so that current 54 in FIG. 1 now flows out of amplifier input 18 through inductor 38, transformer secondary 36 and diode 42 and back to reference terminals 14, 40. Current 54 continues to flow during interval 56 (see FIG. 2), and for convenience of future reference is denoted as $I_{br}$ in FIG. 2 and referred to as the reverse input current. Since amplifier 12 has not yet turned off, the output current $I_c$ continues to flow in the same direction as previously and may, as shown in FIG. 2, even continue to increase for a time after $I_b$ has been reversed. The abrupt reversal of input current $I_b$ is a feature of driver circuit 13.

Interval 56 is referred to in the art as the storage time, and corresponds approximately to the time that is required to extract from amplifier 12 the excess charge stored therein during interval 52 by input current $I_{bf}$. In the case of a bipolar transistor this represents the base charge which places the transistor in saturated forward conduction. In the case of a MOSFET, this represents the charge stored in the gate capacitance and surface inversion layer which places the MOSFET in saturated forward conduction. As those of skill in the art will understand based on the description herein, where amplifier 12 comprises multiple devices or combination of devices, then interval 56 corresponds to the relevant storage time for that combination of devices.

Amplifier output current 53, denoted for convenience by $I_c$, continues to increase during interval 56 until substantially all of the stored charge has been removed from amplifier 12, at which point amplifier output current 53 drops from its peak value $I_{cp}$ toward zero and the amplifier output voltage, measured between terminals 14 and 16 and denoted for convenience as $V_{ce}$ and shown as the lower trace on FIG. 2, rapidly rises. Because of the resonant nature of the load formed by coil 24, diode 20 and capacitor 22, the $V_{ce}$ waveform during first part 59 of final interval 58 is substantially a half sine wave having a peak value denoted as $V_{ceor}$. This is the maximum reverse voltage that the amplifier must block.

Once the peak blocking voltage $V_{ceor}$ has passed, $V_{ce}$ swings negative. This negative going $V_{ce}$ excursion during second part 60 of interval 58 occurs because of the finite amount of time required for diode 20 to turn on. Once diode 20 turns on, $V_{ce}$ is clamped during third part 61 of interval 58 at the diode forward drop. At the end of interval 58, switch 30 closes again and the cycle is repeated.

Figure 4:
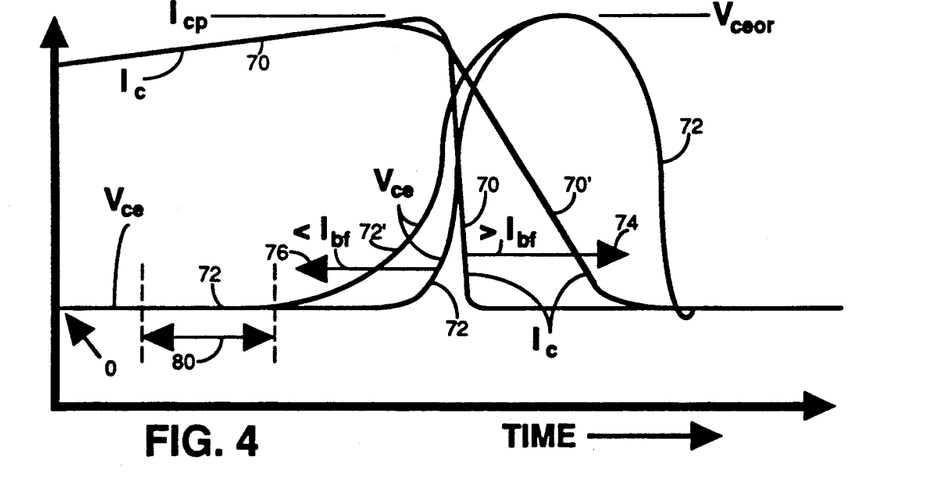
FIG. 4 is a simplified waveform diagram of the output current and output voltage of the power amplifier of FIG. 1 showing further detail.

It is helpful in understanding the invention to consider the amplifier input current $I_b$, the output current $I_c$, the output voltage $V_{ce}$, and the power dissipation at various stages of the repetitive cycle. For convenience of explanation, the magnitude of these voltages and currents will be described for the situation where amplifier 12 is a high power bipolar transistor and and load 19 comprises CRT yoke coil 24, capacitor 22 and diode 20. Typical waveforms are shown in FIGS. 2 and 4. In FIG. 2, the lower part of the $V_{ce}$ waveform has been expanded so that small voltage changes occurring during certain parts of the cycle may be clearly seen despite the presence of peak $V_{ce}$ values (e.g., $V_{ceor}$) that are $10^3$-$10^4$ times larger. In FIG. 4, the $V_{ce}$ scale has not been expanded and these small voltage changes are not apparent.

Those of skill in the art will understand based on the description herein that other types of amplifiers and other types of active devices could also be used, as for example and not intended to be limiting, MOSFET's, JFET's, IGBT's, SCR's, GTO's, and Darlingtons, cascodes, balanced, push-pull or other combinations thereof. The invention described herein applies to these other arrangements as well as other types of loads.

Those of skill in the art will also understand based on the description herein that while the present invention is illustrated in terms of an NPN type amplifier and associated conventions with respect to polarities of various voltages and currents, this is merely for convenience of explanation and not intended to be limiting. References to forward or reverse and to positive or negative and to the magnitude of various voltages and currents, are to be understood as being relative and the same principles of operation apply if these conventions are reversed or if PNP or PMOS devices are substituted for NPN or NMOS devices and the like with appropriate reversal of the power supply polarity, and if the overall magnitudes of the various voltages and currents are varied for different choices of load and active devices.

During interval 52 when input current 50 ($I_b = I_{bf}$) is flowing into amplifier input 18, excess charge may be stored in amplifier 12 and amplifier 12 is substantially in saturated forward conduction. During this interval, the output voltage $V_{ce}$ has a small value denoted as $V_{f1}$ corresponding to the saturated forward voltage drop of the amplifier, which for many semiconductor devices is typically, about $+0.5$ volts. The type MJH16206 bipolar driver transistor manufactured by Motorola, Inc., Phoenix, Ariz. is an example of a typical high performance, bipolar, horizontal deflection transistor suitable for use as amplifier 12.

At the end of interval 52, $I_b$ has risen to its peak forward value (e.g., $I_{bfp} \sim 1.5$ amps). Amplifier input current $I_b$ then reverses during interval 56. Interval 56 is typically shorter than interval 52 and reverse current 54 ($I_b = I_{br}$) is larger than the peak forward current $I_{bfp}$ (e.g., $I_{br} \sim 4-5$ amps). During the first part of interval 56, the amplifier output voltage $V_{ce}$ has a small, but slightly larger value denoted as $V_{f2}$ (e.g., $V_{f2} \sim +1-5$ volts, typically $\sim +2$ volts). This corresponds to the time during which stored charge is being removed from input 18 of amplifier 12 but while there is still sufficient stored charge within amplifier 12 to maintain it substantially in forward conduction, i.e., the amplifier is being driven off but has not yet ceased forward conduction.

At the end of interval 56 when the last of the stored charge is removed, amplifier 12 goes through turn-off. Output current $I_c$ drops from its peak value $I_{cp}$ (e.g., $I_{cp} = \sim 2-20$ amps, typically $\sim 7$ amps) toward zero and the amplifier output voltage $V_{ce}$ begins to rise toward its full blocking voltage $V_{ceor}$ (e.g., $V_{ceor} > /\sim +1000$ volts). It is during this transition interval from conduction to blocking when both $I_c$ and $V_{ce}$ have values different than zero that a substantial amount of transient energy is being dissipated within amplifier 12. While the high-low output current transition in FIG. 2 (middle trace) is shown as being very rapid and resulting in a correspondingly small transient turn-off power dissipation, this is a result of the arrangement of the present invention which will be presently described in more detail.

For purposes of explanation, final interval 58 of repetitive cycle period 48 (see FIG. 2) is divided into subintervals 59, 60, 61. Because of the resonant nature of the load used in connection with the exemplary circuit, $V_{ce}$ exhibits a half sine wave resonant behavior during interval 59 in the first part of interval 58. $V_{ce}$ then swings negative during interval 60 (e.g., $V_{ce} = V_{r1} \sim -8$ to $-20$ volts) while diode 20 is turning on. Once diode 20 turns on, it clamps $V_{ce}$ at the diode forward drop (e.g., $V_{r2} \sim -0.7$ to $-1.0$ volts) during interval 61. At the end of intervals 58, 61, switch 30 closes again and restarts the sweep cycle.

The transient power dissipation during amplifier turn-off is very sensitive to the amount of stored charge and hence to the amount of input drive which produces the stored charge during the forward conduction portion of the cycle. This is illustrated in FIG. 4 which shows in greater detail the portion of cyclic period 48 at the end of interval 56 and the beginning of interval 58 when the amplifier is turning off.

FIG. 4 shows in greater detail how the output current and output voltage of amplifier 12 vary the during time period when the amplifier is turning off and blocking the resonant voltage swing, i.e., during intervals 56, 59, 60 of FIG. 2. Compared to FIG. 2, the voltage scale for $V_{ce}$ in FIG. 4 is not enlarged. Thus, the small $V_{ce}$ values (e.g., $V_{f1}$ and $V_{f2}$) which occur during intervals 52 and 56 cannot be distinguished from $V_{ce} = 0$ in FIG. 4.

$I_c$ trace 70 and $V_{ce}$ trace 72 in FIG. 4 correspond to the $I_c$ and $V_{ce}$ traces shown in FIG. 2 when circuit 10 is adjusted to provide minimum transient power dissipation. It has been found that an important factor in minimizing the transient power dissipation is adjusting amplifier input current $I_{bf}$ (e.g., current 50 in FIG. 1 and the upper trace in FIG. 2) during interval 52 so as to provide adequate drive current 50 to turn amplifier 12 on during interval 52 while minimizing the stored charge that must be later removed during interval 56 by current 54. FIG. 4 shows how the $I_c$ and $V_{ce}$ traces are affected by increasing and decreasing the amount of $I_{bf}$ during interval 52. Increasing $I_{bf}$ has the effect of extending the falling portion of $I_c$ trace 70 to the right in the direction of arrow 74 to location 70', i.e., toward later time. Decreasing $I_{bf}$ has the effect of extending the rising portion of $V_{ce}$ trace 72 to the left in the direction of arrow 76 to location 72', i.e., toward earlier time. Having $I_c$ fall more gradually or $V_{ce}$ rise more gradually increases the transient $I_c \cdot V_{ce}$ product and increases the switching power dissipation.

It has been discovered that the transient power dissipation may be minimized by adjusting amplifier drive $I_{bf}$ to have the optimum value and that the optimum value may be determined by sampling the amplifier output during the storage time. The value of $V_{f2}$, i.e., the value of $V_{ce}$ during interval 56 provides a means for detecting when and if the optimal amount of forward amplifier input drive $I_{bf}$ is being provided so as to maintain amplifier 12 operating at minimum transient power dissipation. For example, when amplifier 12 is a Type MJH16206 SCANSWITCH TM bipolar power transistor manufactured by Motorola, Inc., Phoenix, Ariz., the desirable values of $V_{f2}$ are in the range of about 1 to 3 volts with 1.5-2.5 volts being convenient and about 2 volts being preferred. (SCANSWITCH is a trademark of Motorola, Inc.) Those of skill in the art will understand based on the description herein how to determine the appropriate values of $V_{f2}$, or equivalent parameter sensitive to the magnitude of the stored charge, for other amplifiers.

Sampling interval 80 (see FIG. 2) is chosen to be approximately centrally located within storage interval 56, more precisely, to be located within interval 56 so as to be substantially free from the transients encountered at the beginning and end of interval 56. During interval 80, the value of $V_{ce}$, e.g., $V_{f2}$, is sampled and stored. This measured value of $V_{ce}$ during interval 80 (or other parameter proportional to the excess charge stored during interval 52) is then used via a time delay arrangement to control current 50 in FIG. 1 (i.e., $I_{bf}$ in FIG. 2) during interval 52.

In a first embodiment, the desired amount of $I_{bf}$ is determined by comparing $V_{f2}$ (or a value proportional to $V_{f2}$) to a pre-set reference value $V_{ref}$ and then adjusting $I_{bf}$ until $V_{f2}=V_{ref}$ or some predetermined function of $V_{ref}$. This approach has the advantage of being particularly simple to implement. An alternative approach to reducing transient power dissipation is to measure the transient power dissipation (e.g., $I_c \cdot V_{ce}$) during the switching interval and then adjust $I_{bf}$ to minimize $I_c \cdot V_{ce}$. This provides automatic compensation over a wider range of variables, but is more complex to implement.

Figure 5:
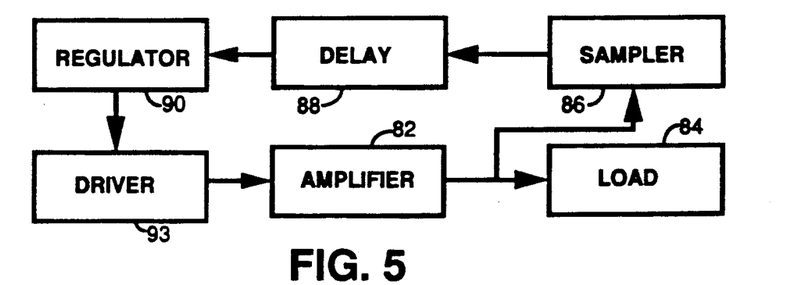
FIG. 5 is a simplified block diagram of the improved power amplifier arrangement of the present invention according to a preferred embodiment.

FIG. 5 shows the arrangement of the present invention in simplified block diagram form. Amplifier 82 drives load 84. Amplifier 82 is analogous to amplifier 12 of FIG. 1 and driver 93 is analogous to driver 13 of FIG. 1, but other amplifiers and drivers may also be used. Load 84 may comprise coil 24, capacitor 22 and diode 20 as in FIG. 1 or another load of any kind. Sampler 86 senses the output of amplifier 82 near or during the switching interval when amplifier 82 is about to or is dissipating a substantial amount of transient energy, as for example, during or at the end of the charge storage interval when amplifier 82 is turning off. A signal proportional to the sampled output is fed back through time delay means 88 to regulator 90 so as to adjust the amount of energy, current or charge being supplied to amplifier 82 through driver 93 when amplifier 82 is conducting or becoming conductive (i.e., when excess charge is being stored in amplifier 82). The feedback signal is of a polarity so as to adjust the amplifier drive provided by driver 93 to amplifier 82 to reduce or minimize the transient energy dissipation within amplifier 82.

Figure 6:
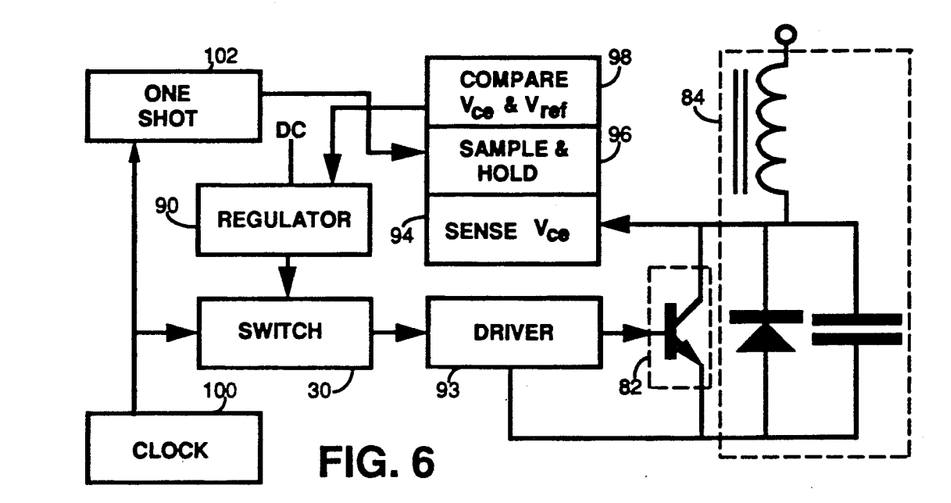
FIG. 6 is a further block diagram of the improved power amplifier arrangement of FIG. 5 showing further detail and according to a first embodiment.
Figure 7:
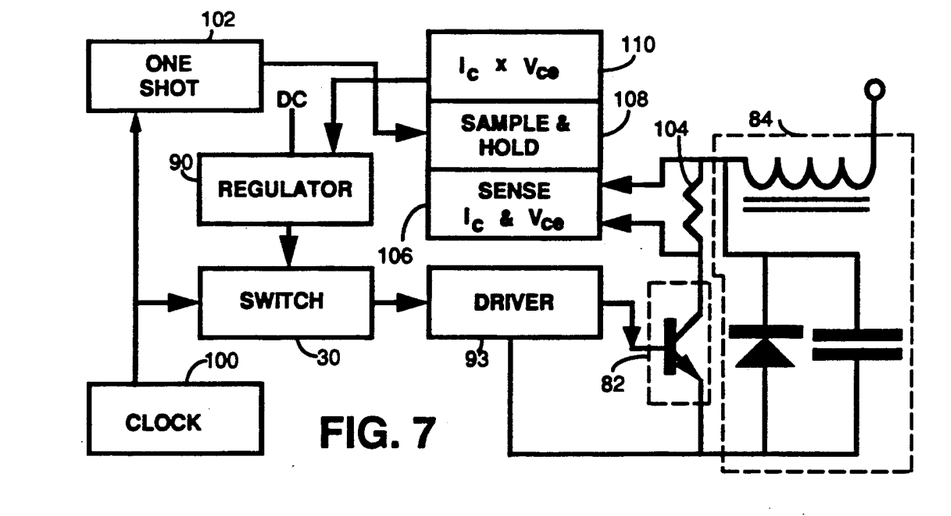
FIG. 7 is a still further block diagram of the improved power amplifier arrangement of FIG. 5 showing further detail and according to a second embodiment.

The block diagrams shown in FIGS. 6 and 7 illustrate how this is accomplished in greater detail. Load 84 in FIGS. 6–7 corresponds to resonant CRT horizontal deflection load 19 of FIG. 1 and amplifier 82 corresponds to the bipolar transistor illustrated in FIG. 1. This is intended merely for convenience of explanation and not to be limiting. Those of skill in the art will understand based on the description herein that other loads and other amplifiers could also be used.

FIG. 6 illustrates an arrangement wherein the value of $V_{ce}$, sensed by block 94, and delayed by sample and hold block 96, is compared in block 98 to a predetermined reference value ($V_{ref}$) and the difference ($V_{f2}-V_{ref}$ or $V_{ref}-V_{f2}$) fed back to regulator 90 to adjust the input energy, current or charge being provided through switch 30 and driver circuit 93 to amplifier 82. The timing of the sense, sample and hold functions, and compare functions is controlled by clock 100 (e.g., the horizontal oscillator for the CRT driver) fed through, for example, one-shot 102 to sense, sample and hold and compare blocks 94, 96 and 98. The order in which the sense, sample, hold, and compare functions are performed may be varied provided that the value being sensed corresponds in time to an interval when the charge necessary to turn or hold the amplifier on has already been stored in the amplifier, and the feedback to regulator 90 corresponds in time to a subsequent interval when the charge necessary to turn or hold the amplifier on is about to be or is being stored in amplifier 82.

It is convenient that the amplifier output be sensed when the stored charge is about to be or is being removed from the amplifier, and that the feedback adjust the energy, current and/or voltage being supplied through regulator 90, switch 30 and driver 93 to amplifier 82 during at least a portion of the subsequent interval when amplifier 82 is intended to be on again. Between the sense/sample interval and the amplifier-on-again interval, the amplifier turns off. Hence, the time delay desirably corresponds approximately to at least the intervening amplifier-off interval. The arrangement illustrated in FIG. 6 has the advantage that is is relatively simple and easy to implement, and comparing the sampled amplifier output to a predetermined reference is sufficient to substantially reduce the transient power dissipation of many amplifiers, even when amplifier or amplifier components whose characteristics vary somewhat from the design amplifier characteristics are substituted.

For example, in the circuit of FIG. 1 employing a Type MJH16206 SCANSWITCH or similar transistor as a horizontal deflection amplifier for a CRT, it was found that the arrangement of FIG. 6 cut the transient power dissipation (TPD) in the transistor typically by half. Further, when different power amplifier devices of nominally the same type were substituted, but which had normal variations in gain, $V_{cbo}$, $f_t$, $V_{ceo}$, lifetime and/or other parameters, the variation in transient power dissipation ($\Delta TPD$) with different devices was reduced from typically $\Delta TPD=2:1$ to typically $\Delta TPD=1.1-1.2:1$. These improvements are very important for practical applications because (1) the lower overall transient power dissipation substantially decreases the operating temperature of the amplifier, thereby providing extended operating life and/or reducing the cooling requirements and costs, and/or permitting the amplifier to be operated at a higher frequency and/or power level for improved performance per amplifier dollar, and (2) the lowered sensitivity to individual amplifier parameter variations permits lower cost (wider tolerance) devices to be utilized and still achieve the same or improved performance. As a consequence of this combination of features, the present invention provides substantially improved performance, lower cost, greater design flexibility and/or any combination thereof. These are much desired advantages.

FIG. 7 illustrates another embodiment of the present inventions. The arrangement of FIG. 7 is similar to that in FIG. 6 except that current sense impedance or transformer 104 has been included so that both $I_c$ and $V_{ce}$ may be sensed by circuit 106. Sample and hold 108 provides substantially the same function as in connection with sample and hold 96 of FIG. 6, but with respect to both variables or their product. Multiplier 110 combines $I_c$ and $V_{ce}$ so as to provide an output proportional to the product thereof, i.e., $I_c \cdot V_{ce}$, which is related to the transient power dissipation. This transient power measurement may be the instantaneous transient power at a predetermined time in the cycle or may be integrated over a portion or all of the the turn-off interval. In either case, the result is fed back after suitable delay to regulator 90 so as to adjust the input energy, current or voltage to amplifier 82 during the turn-on or on portion of the cycle so as to minimize the transient power dissipation. As will be apparent from FIGS. 2 and 4, the sampling interval for determining $I_c \cdot V_{ce}$ is slightly later than the sampling interval (e.g., interval 80) for determining $V_{ce}=V_{f2}$. Those of skill in the art will understand that it is desirable to sample $I_c \cdot V_{ce}$ during the time when $I_c \cdot V_{ce}$ is large. In general, this occurs slightly after interval 80 in FIGS. 2, 4, that is, when $I_c$ and $V_{ce}$ are rapidly changing, as for example at the end of interval 56 and beginning of interval 59.

The transient power dissipation exhibits a minimum with respect to variations in the input drive to the amplifier, e.g., with respect to $I_{bf}$. Various means may be used to determine the polarity of the feedback so as to force the input drive to the condition of minimum power dissipation, e.g., to adjust $I_{bf}$ for minimum transient power dissipation. One example of a suitable means is to provide a feedback signal proportional to $V_{ce}=V_{fl}$ as well as to $I_c \cdot V_{ce}$. Since $V_{fl}$ varies monotonically with changes in $I_{bf}$ (see FIG. 2, lower trace, right half), it may be used in combination with the $I_c \cdot V_{ce}$ product to attain the minimum transient dissipation. Circuits for implementing the various blocks described in connection with FIGS. 5-7 and for controlling an input (e.g., $I_{bf}$) to optimize a variable (e.g., $I_c \cdot V_{ce}$ versus $I_{bf}$) exhibiting a minimum based on an associated monotonic variable (e.g. $V_{fl}$ versus $I_{bf}$), are well known in the art. Those of skill in the art will understand based on the description herein how to implement such circuits to the necessary feedback proportional to $V_{fl} - V_{ref}$ and/or $I_c \cdot V_{ce}$ and $V_{ce} = V_{fl}$ to optimize the amplifier transient power dissipation performance.

Figure 8:
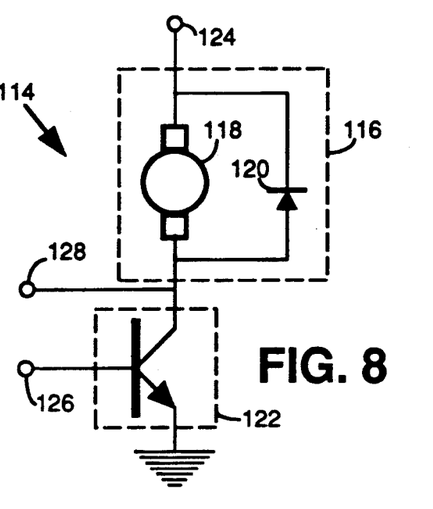
FIGS. 8-9 are simplified schematic diagrams showing the present invention used in connection with different loads.
Figure 9:
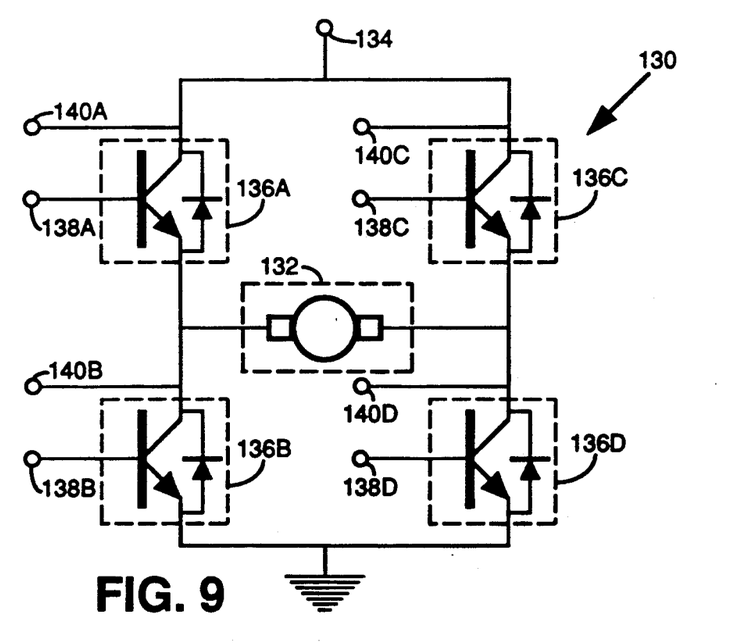

FIGS. 8-9 illustrate how the present invention may be used to drive other types of loads besides the resonant CRT deflection coil, capacitor and diode combination shown by way of example in FIGS. 1 and 6-7, or equivalent. FIG. 8 shows amplifier-load arrangement 114 wherein load 116 comprises motor 118 and shunt diode 120. Load 116 is driven by amplifier 122. Load 116 is an example of load 84 and amplifier 122 is an example of amplifier 82 in FIG. 5. DC connection 124, amplifier input connection 126 (e.g., from driver 93 of FIG. 5) and feedback connection 128 (e.g. to sampler 86 of FIG. 5) are provided. The remaining parts of the feedback control circuit are arranged as in FIG. 5 and are not shown in FIG. 8. Connection 128 is used to measure the output of amplifier 122 during the storage time. The measured value is then processed as described in connection with FIGS. 5-7 to control the forward drive to amplifier 122 to minimize the transient dissipation.

FIG. 9 illustrates more complex motor drive circuit 130, comprising motor load 132, DC power connection 134 and four amplifiers 136A-D, each with input connections 138A-D analogous to connection 126 of FIG. 8, and feedback connections 140A-D, analogous to feedback connection 128. A circuit similar to FIG. 5 is provided in connection with each amplifier 136A-D, utilizing the corresponding input and feedback connections 138A-D and 140 A-D. The operation of the FIG. 5 circuits associated with each amplifier is controlled by a master clock. By adjusting the timing, duration and repetition rate of the "on" period of each amplifier, the direction of speed of rotation can be selected at will. Means and methods for doing this are well known in the art and, based on the description herein those of skill in the art will understand how to further adjust the input drive to the amplifiers to minimize the transient power dissipation as each amplifier turns on and off based on the sampled data obtained during the switching intervals, and after suitable delay used to control the drive during, for example, the next "on" interval, as has been previously described. While FIGS. 8-9 illustrate arrangements in which single phase motors are employed, analogous arrangements are used for multiphase motors. For example, with a three phase motor, six amplifiers analogous to the four amplifiers 136A-D are used with the three phase motor windings connected to the analogous points between the six amplifiers. Based on the description herein, persons of skill in the art will understand how the present invention is applied to such multiphase motors or to other types of loads.

Figure 10:
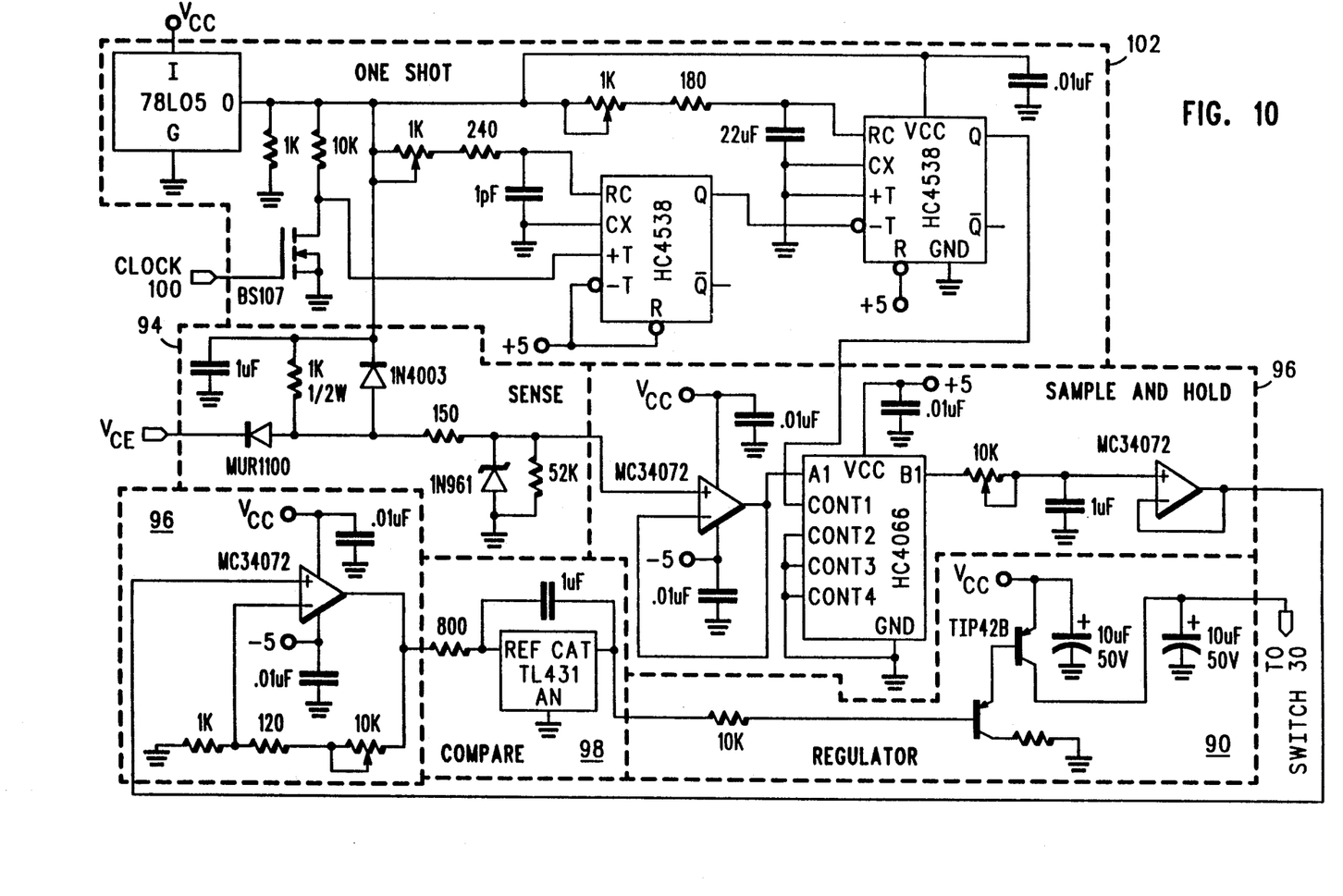
FIG. 10 is a simplified schematic/block diagram according to a preferred implementation of the present invention for a CRT horizontal deflection system.

FIG. 1, 3 and 10 show exemplary circuits for implementing the arrangement of FIGS. 5-6 and suitable for use in a horizontal deflection system for a CRT. For example, referring to FIG. 6, block 93 corresponds to block 13 of FIG. 1 and block 30 of FIG. 6 corresponds to block 30 of FIG. 3. Non-limiting exemplary implementations of blocks 90, 94, 96, 98, and 102 of FIG. 6 are shown in FIG. 10. Typical component values and device choices are included. These circuits are provided by way of illustration of preferred embodiments and not intended to be limiting. The various dashed lines shown in FIG. 10 correspond to the blocks illustrated in FIGS. 5-6 and are similarly named and numbered. Clock 100 may be any clock circuit, as for example, the horizontal oscillator clock of the CRT deflection system. Such clock oscillators are well known in the art. As those of skill in the art will appreciate, the circuitry or connections between the various blocks are routine interface or coupling arrangements within the perview of such persons. Persons of skill in the art will also understand, based on the description herein, how the circuits of FIGS. 1, 3, and 10 operate without further detailed explanation.

Having thus described the invention, those of skill in the art will appreciate that the invented arrangement and method provides substantial improvement over the prior art by decreasing the transient power dissipation of power amplifiers used to drive all kinds of loads, and especially inductive and/or resonant loads. It will be further appreciated that the improved means and method of the present invention provides decreased sensitivity to parameter variations of individual amplifiers or amplifier components. It will be still further appreciated that the combination of the above virtues allows such power amplifiers to be operated at lower temperatures or higher frequencies or higher power levels or allows use of devices of lower cost or provides extended amplifier operating life or provides a combination of the above. The invented means and method are especially well suited for driving inductive loads such as are encountered in high speed CRT deflection power amplifiers, motor controls, power supplies and the like.

While the present invention has been illustrated in terms of an elementary input switching means and of a bipolar transistor output amplifier driving an inductive load coupled to a capacitor and diode and of various resistors for parasitic transient suppression, it will be apparent to those of skill in the art based on the teachings herein that various modifications and additions may be made to the present invention without departing from the spirit thereof, as for example and not by way of limitation, by employing other types of output amplifying devices and/or circuits and other types of input switching means and other components or combinations for suppressing switching transients and other circuit configurations for coupling the amplifier output to the load and utilizing other arrangements for providing the delayed feedback signal to the amplifier input based on a sampled output measurement. Accordingly, it is intended to incorporate these and other variations as will occur to those of skill in the art based on the teachings herein in the claims that follow.

What is claimed is:

1. A circuit for cyclically driving a load and minimizing transient energy dissipated in the circuit, comprising:

an amplifier having an output terminal coupled to the load and having an input terminal;

driver means coupled to the input terminal of the amplifier for providing current thereto during a first portion of a drive cycle and receiving current therefrom during a second portion of the drive cycle;

sampling means coupled to the output of the amplifier for measuring the output of the amplifier during a portion of the drive cycle following the first portion of the drive cycle; and regulator means coupled to the sampling means and the driver means for optimizing the current provided to the input of the amplifier during the first portion of a subsequent drive cycle in response to the output of the amplifier measured by the sampling means during the portion of the drive cycle following the first portion of the drive cycle to minimize transient energy dissipated in the circuit.

2. The apparatus of claim 1 wherein the amplifier includes a bipolar transistor and the sampling means measures a value related to the collector-emitter voltage of the bipolar transistor.

3. The apparatus of claim 2 wherein the sampling means measures the output of the amplifier during a part of the second portion of the drive cycle when the voltage of the amplifier output is of a direction the same as during the first portion of the cycle but input current is of a direction opposite to that during the first portion of the drive cycle.

4. The device of claim 1 wherein the driver means provides a current having a first direction during the first portion of the cycle and having a second, opposite direction during a first part of the second portion of the cycle and wherein the sampling means measures the amplifier output during a first part of the second portion of the cycle.

5. A circuit for cyclically driving a load, comprising:

an amplifier having output terminals coupled to the load and a common terminal and having an input terminal;

driver means including an inductor having first and second terminals wherein the first terminal is coupled to the input terminal of the amplifier for providing current thereto during a first portion of a drive cycle and receiving current therefrom during a second portion of the drive cycle, the driver means further including a transformer having primary and secondary windings, the transformer being coupled to the second terminal of the inductor and to a switch for periodically supplying current thereto;

sampling means coupled to the output of the amplifier for measuring the output of the amplifier during a portion of the drive cycle following the first portion of the drive cycle; and regulator means coupled to the sampling means and the driver means for adjusting the amount of current provided to the input of the amplifier during the first portion of a subsequent drive cycle in response to the output of the amplifier measured by the sampling means during the portion of the drive cycle following the first portion of the drive cycle.

6. A circuit for cyclically driving a load as claimed in claim 5 wherein the amplifier exhibits a low first output voltage during a first time period approximately coextensive with the first portion of the drive cycle, a second higher output voltage of the same polarity during a second time period in the second portion of the drive cycle and a third, larger, output voltage of the same polarity during a third time period in the second portion of the drive cycle, the sampling means measuring the output of the amplifier after the first time period.

7. A circuit for cyclically driving a load as claimed in claim 6 wherein the sampling means measures the output of the amplifier during the second time period.

* * * * *